United States Patent [19]

Kleinknecht et al.

[11] 4,200,396
[45] Apr. 29, 1980

[54] OPTICALLY TESTING THE LATERAL DIMENSIONS OF A PATTERN

[75] Inventors: Hans P. Kleinknecht, Bergdietikon, Switzerland; Wolfram A. Bösenberg, Monmouth Junction, N.J.

[73] Assignee: RCA Corporation, New York, N.Y.

[21] Appl. No.: 862,190

[22] Filed: Dec. 19, 1977

[51] Int. Cl.² ............................................. G01N 21/32
[52] U.S. Cl. ................................ 356/384; 350/162 R; 356/354; 356/394
[58] Field of Search ............... 356/111, 156, 168, 354, 356/384, 394; 250/550; 350/162 R, 162 SF

[56] References Cited

U.S. PATENT DOCUMENTS

| | | | |
|---|---|---|---|
| 3,756,695 | 9/1973 | Mino et al. | 350/162 SF |
| 3,988,564 | 10/1976 | Garvin et al. | 219/121 EM |
| 4,030,835 | 6/1977 | Firester et al. | 356/111 |
| 4,039,370 | 8/1977 | Kleinknecht | 356/111 |

OTHER PUBLICATIONS

Vasil'eva et al., "Measurement of the Selective Growth and Etching Rates of GaAs", *Inorganic Materials*, vol. 12, Feb. 1976, pp. 162-164.
Rassudova et al., "Precision Diffraction Gratings for Metrologic Purposes", *Optics and Spectroscopy*, Aug. 1961, pp. 136-137.
Bilenko et al., "Monitoring the Thickness of Layers During the Process of Selective Accretion or Etching"; Translation from Pribory I Tekhnika Eksperimenta, No. 5, pp. 231-233, Sep.-Oct. 1972.

*Primary Examiner*—John K. Corbin
*Assistant Examiner*—R. A. Rosenberger
*Attorney, Agent, or Firm*—H. Christoffersen; D. S. Cohen; T. H. Magee

[57] ABSTRACT

A method of optically testing the lateral dimensions of a pattern of material disposed on a substrate comprises applying the material to both the main area of the substrate and a test area on the same substrate, and selectively removing the material from both areas on the substrate simultaneously to form respectively the pattern on the main area and a diffraction grating on the test area. The diffraction grating is exposed to a beam of light, and the intensity of two of the diffracted beams is measured to obtain a ratio signal ($I_2/I_1$), which is then utilized to determine the lateral dimensional tolerance of the integrated circuit pattern.

10 Claims, 4 Drawing Figures

OPTICALLY TESTING THE LATERAL DIMENSIONS OF A PATTERN

This invention relates to a technique for optically testing the lateral dimensions of a pattern of material disposed on a substrate.

In manufacturing integrated circuit (IC) devices and masks, many steps are performed in which a pattern of material is disposed on a substrate. The material typically comprises a masking layer of photoresist which is selectively exposed to light through a mask and then developed into the overlying pattern, which ultimately determines the lateral dimensions of the integrated circuit device formed in the substrate. While integrated circuits can be manufactured with submicrometer control in diffusion depth (z direction), the lateral dimensions (x-y directions) can, however, vary by several micrometers due to variations of exposure settings during mask generation, due to variations of photoresist application, exposure and development, and due to variations in lateral etching. The newer integrated circuits have tighter lateral dimensional tolerances, which requires checking of these dimensions at various stages of processing the masks and substrates. For example, the lateral dimensions must be checked after photoresist development in order to identify and correct dimensional variations before extensive reprocessing becomes necessary.

At the present time, the dimensional checking of integrated circuit patterns is done manually using a microscope equipped with a filar eye piece. This requires skilled personnel and is very time consuming; the accuracy and reliability is operator dependent; and there is a problem of operator fatigue. An automatic checking system would eliminate such inaccuracies and would allow a larger quantity of complex circuit patterns to be examined quickly and accurately. The present invention provides a technique for testing the lateral dimension of an integrated circuit pattern without the use of a microscope.

Figures 1, 2:
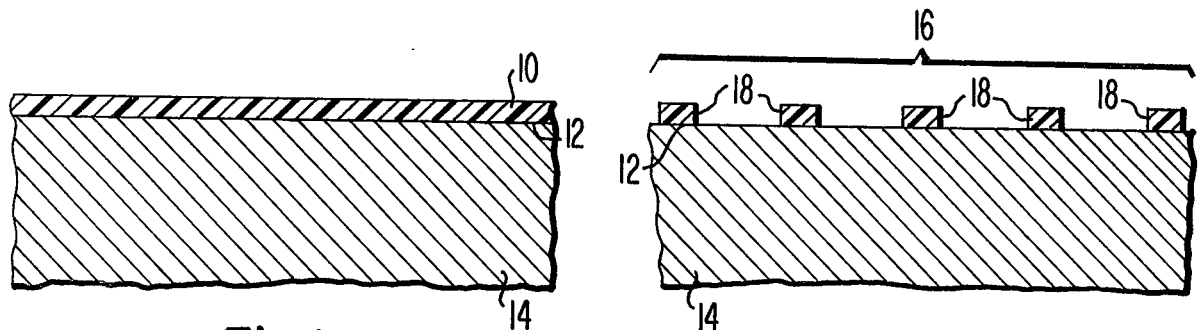
FIGS. 1 and 2 are cross-sectional views showing one embodiment of a diffraction grating profile utilized in the present novel method.

Referring to FIG. 1 of the drawings, the first step of the present method comprises applying a layer 10 of material to a test surface 12 of a substrate 14. Typically, the substrate 14 containing the test surface 12 comprises a portion of a large semiconductor wafer or mask having an integrated circuit pattern of the same material disposed thereon, whose lateral dimensions are to be optically tested by the present novel method. The pattern being tested may comprise a layer 10 of etched silicon dioxide, silicon nitride, polycrystalline silicon or metal. In the present embodiment, the material is a masking layer 10 of photoresist and the substrate 14 is a portion of a silicon wafer. Such a portion may conveniently comprise a knock-out section of the silicon wafer, i.e., an unused section in the middle of the wafer, or may even fit onto the side of each step and repeated circuit pattern. The present method is also applicable for testing the lateral dimensions of an integrated circuit pattern of an emulsion or metallic oxide disposed on a glass integrated circuit mask.

The material is then selectively removed from both the semiconductor wafer and the smaller test surface 12 simultaneously to form respectively the integrated circuit pattern on the wafer and a diffraction grating 16 on the test surface 12, as shown in FIG. 2. The diffraction grating 16 includes spaced strips 18 of the material having a strip width W and a periodicity d. In one experimental embodiment, the grating 16 had a size of about 0.5×0.5 mm, a strip width, W, equal to about 5 micrometers, and a periodicity, d, equal to approximately 20 micrometers. In the present example where the material is photoresist, the removing step is performed by selectively exposing the photoresist to light utilizing an appropriately patterned mask and then developing, using conventional photolithographic techniques known in the art. Since the photoresist on both the wafer and the test surface 12 is removed simultaneously and thereby subjected to the same critical processing parameters such as exposure time and development time, the diffraction grating 16 can be utilized as a test pattern for optically checking the lateral dimensions of the integrated circuit pattern. In other words, the final width, W, of the strips 18 in the diffraction grating 16 will be a measure for the width of the photoresist lines in the adjacent integrated circuit pattern on the same wafer and, consequently, can be used to check the processing parameters (photoresist thickness, exposure time and development time) with respect to the lateral dimensional tolerances. In other embodiments, the pattern being tested and strips 18 of the grating 16 may comprise other materials, such as silicon dioxide, silicon nitride, polycrystalline silicon or metal.

Figure 3:
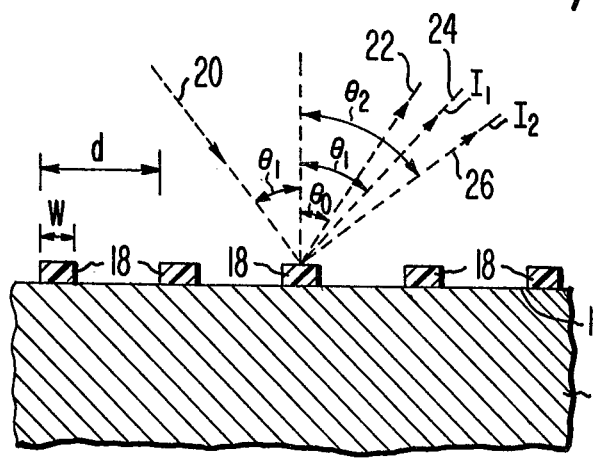
FIG. 3 is the cross-sectional view shown in FIG. 2 further illustrating diagrammatically a beam of light striking the diffraction grafting profile and being diffracted into diffracted beams of the zero, first, and second orders.

Referring to FIG. 3, the diffraction grating 16 is now exposed to a beam 20 of monochromatic light, such as a laser beam. The diffraction grating 16 and the test surface 12 therebeneath function as a relief pattern, diffracting the beam of monochromatic light into a diffraction pattern including a zero order beam 22, a first order beam 24, and a second order beam 26. In one experimental embodiment, the light beam 20 had a diameter of approximately two (2) millimeters, striking the diffraction grating 16 uniformly, so that all portions thereof were uniformly exposed to the incident light beam 20. The use of He-Ne gas laser having a wavelength, λ, equal to 0.6328 micrometers is preferred due to the fact that it is relatively cheap, reliable, and convenient to use; its wavelength can easily be detected by a silicon diode or phototransistor; and the photoresist is insensitive to this wavelength.

The relief pattern illustrated in FIG. 3 is utilized as a reflection phase grating wherein the grating 16 diffracts the incident light beam 20 into diffracted beams of various orders whose intensities are dependent upon the resulting interference of different reflected and diffracted light rays. The angular positions of the various diffracted orders depend only on the grating period, d, and on the wavelength, λ. The diffraction angle, θ, for a diffraction grating, is a function of λ and d according to the following expression:

$$\sin \theta = \sin \theta_I + m\lambda/d$$

where $\theta_I$ is the angle of the incident light beam 20, as shown in FIG. 3, d is the periodicity, and m is the diffraction order. In the present example, the first and second order diffracted beams 24 and 26 are utilized, where m is equal to 1 and 2, respectively. The above equation then becomes:

$$\sin \theta_1 = \sin \theta_I + \lambda/d$$

$$\sin \theta_2 = \sin \theta_I + 2\lambda/d$$

where $\theta_1$ and $\theta_2$ are the diffraction angles for the first and second order beams 24 and 26, respectively, as shown in FIG. 3. Utilizing a laser beam which strikes the diffraction grating 16 uniformly at an angle perpendicular to the plane of the diffraction grating 16 and which has a wavelength, $\lambda$, equal to 0.6328 micrometers, one will obtain, for a diffraction grating having a periodicity equal to 20 micrometers, a first order diffraction angle, $\theta_1$, equal to about 1.8° and a second order diffraction angle, $\theta_2$, equal to about 3.6°. One may then measure the intensity of these first and second order beams 24 and 26, $I_1$ and $I_2$, respectively, by utilizing photodetectors placed at the appropriate diffraction angles $\theta_1$ and $\theta_2$ to receive the first and second order beams 24 and 26, respectively.

A part of the light beam 20 which strikes the diffraction grating 16 is reflected from the top surface thereof while other parts (not shown) of the beam 20 enter the strips 18 of photoresist and then go through one or more internal reflections before emerging therefrom. The measured intensity of the diffracted beams is a result of the interference of these partial beams. The intensity of the diffracted beams will change in value if the width, W, of the strips 18 changes, as a result of the changing interference of the diffracted and reflected beams.

After measuring the intensity of the first order beam 24 and the second order beam 26, $I_1$ and $I_2$, respectively, one next obtains a ratio signal ($I_2/I_1$), typically by means of an electronic analog divider, comprising in the present example the second order beam intensity divided by the first order beam intensity. For a rectangular diffraction grating 16, the strip width, W, is a function of this ratio signal ($I_2/I_1$) and is then determined by utilizing, in the present example, the approximation $W = d/\pi \cos^{-1}\sqrt{I_2/I_1}$, where d is the known periodicity of the diffraction grating 16. Although the present embodiment discloses the use of a rectangular relief pattern for the diffraction grating 16, since it is particularly simple to fabricate and to analyze, other shapes of periodic gratings may be utilized, albeit more difficult to make and requiring more mathematics for interpretation.

The next step of the present novel method is to compare the strip width, W, with a pre-established value to obtain a difference signal, whereby the magnitude of the difference signal is a measure for the lateral dimensional tolerance of the integrated circuit pattern. In the present embodiment, this comparing step is actually performed by processing means utilizing a computer to rapidly calculate, from the ratio signal ($I_2/I_1$), a value for the ratio of W/d, i.e., the strip width divided by the periodicity constant. This ratio (W/d) is then compared with the desired W/d ratio. In actual testing operations, electronic gating for lower and upper limits of W/d can be programmed into the computer, which can then automatically sort the semiconductor wafers into selected categories. For this purpose, we have adapted a Semi-Automatic Wafer Inspection Machine, Model 671 of Kulicke and Soffa, to our laser test equipment. Utilizing the present novel method, this machine is able to process one wafer every seven seconds.

The present method allows the rapid measurement of W (if the grating period, d, is known) in an objective way without the use of a microscope. This new technique gives the width W of the photoresist strips averaged over the whole grating area. It is not sensitive to defects on the test pattern, since the measured intensities result from the total of the laser-illuminated grating pattern. The method can be used for checking masks as well as checking wafers at various stages in the process. Our technique is particularly suited for testing masks, because here the grating test patterns are ideally square wave. A number of runs showed that the laser technique in this case is more accurate and more reliable than our capability of measuring the grating strip widths in the microscope, namely better than ±0.5 micrometers. Although the pattern being tested in the present example comprises photoresist, the present method is equally applicable for optically testing patterns of other materials such as, for example, silicon dioxide, silicon nitride, polycrystalline silicon, and various metallic conductors.

In our work we found d = 20 micrometers to be a good compromise for the grating constant of the test patterns. Taking a differential of the above equation indicates that the highest sensitivity and accuracy of the measurement, i.e., the largest change of $I_2/I_1$ for a given change of W/d, will be for W/d = 0.25 ($I_2/I_1 = 0.5$). At the same time it is desirable to make the strip width, W, in the grating 16 approximately equal to the width of the smallest structure in the circuit pattern. At the present state of the art this may be typically five micrometers, which means W = 5 micrometers and d = 20 micrometers. The grating gives very good diffraction reflexes for a grating area as small as 0.5 × 0.5 millimeters² (20 mils × 20 mils). With ±10% measurement accuracy, one then gets an absolute accuracy of ±0.5 micrometers, which is satisfactory for present integrated circuit devices.

The correlation between the W/d data measured with our laser machine and the microscopically measured values has been within 10% for positive photoresist samples. However, for some layer thicknesses and refractive indices in the structure of the grating 16 such as, for example, test patterns of negative photoresist, the grating characteristic becomes somewhat non-rectangular which tends to invalidate the above relationship between the line width, W, and the intensity ratio $I_2/I_1$. For these cases, measurement under Brewster's angle incidence was tried and turned out to be successful. The beam of monochromatic light is aimed to strike the rectangular relief pattern uniformly at an angle of incidence $\theta_I$ equal to Brewster's angle, defined by the relationship TAN $\theta_I = n$, where n is the refractive index for the material. The plane of incidence in this case must be parallel to the grating strips 18, and the polarization (electric vector) of the incident light beam must be in the plane of incidence. Under these conditions, the characteristic of the grating test pattern follows the rectangular approximation formula more closely. This is so, because under these conditions the reflection at the air-photoresist interface is suppressed, which eliminates the multiple beam interference within the photoresist. As a result, one has a pure phase grating for which the non-rectangular contribution can be neglected.

Figure 4:
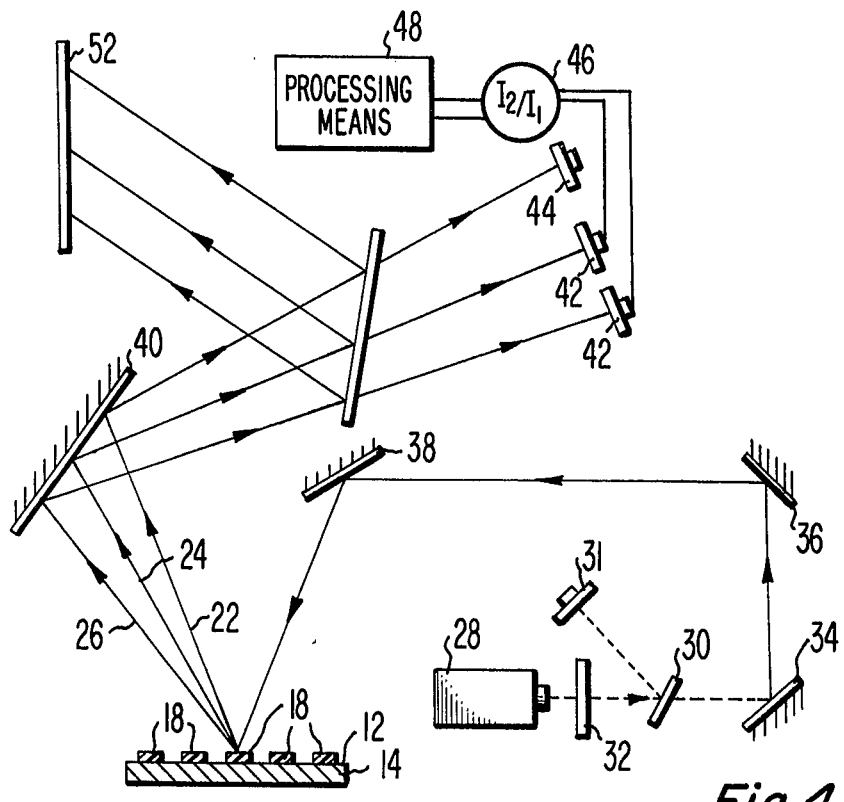
FIG. 4 is a diagrammatic view illustrating one embodiment of an apparatus utilized to practice the present novel method.

Referring to FIG. 4, there is shown one embodiment of an apparatus utilized to practice the present novel method. A monochromatic light source, such as, for example, a He-Ne laser 28 is positioned so that the beam 20 of light therefrom strikes a beam splitter 30 which reflects part of the light to a silicon solar cell 31 which acts as a reference detector. Preferably, a chopper 32 is also utilized, which, in the present example, chops the light beam 20 at about 26 hertz. By utilizing a chopper 32, the background noise is reduced when a lock-in amplifier is tuned to pick up only the AC signal generated by the chopped light beam 20. A series of mirrors 34, 36, and 38 then directs the laser beam 20 at the diffraction grating 16 disposed on the test surface 12. The mirrors 36 and 38 can be tilted by remote control for ease of adjusting the position of the light beam 20 on the substrate 14. The diffracted beams 24 and 26 are then reflected from another mirror 40 so that the intensity of the diffracted beams 24 and 26 may be measured by utilizing photodetectors 42 placed at the appropriate angular positions to receive the diffracted beams 24 and 26. A third detector 44 acts as a quadrant detector which senses the position of the zero order beam 22 and, with a servo system, controls the tilt of the mirror 40 such that the zero order beam 22 always stays in the center of the quadrant detector 44. In the present embodiment, the photodetectors 42 and 44 comprise silicon PIN diodes (reverse biased at 10 volts), which are used in conjunction with lock-in amplifiers (not shown) to generate a signal with reduced background noise.

In the present embodiment, the two intensity measurements, $I_1$ and $I_2$, are then put through an electronic analog divider 46 to obtain the ratio signal ($I_2/I_1$). This ratio signal is then transmitted to processing means 48 for determining the strip width W and comparing the strip width W with a pre-established value to obtain the difference signal. Typically, the ratio $I_2/I_1$ is displayed for control purposes on an analog meter which is calibrated in W/d units according to the above equation. As an additional control, the diffraction beam pattern may be partly reflected by a glass plate 50 onto a transluscent screen 52. This display of the diffraction pattern can be used to adjust the primary beam by setting mirror 36, and for determining the grating period, d, in case of ambiguity if several grating test patterns are used on the substrate 14.

The present novel technique provides an objective and quantitative method for optically testing the lateral dimensions of an integrated circuit pattern of material disposed on a substrate which requires no microscopic observation and no touching of the substrate which may cause damage or contamination. Suitable electronic circuitry produces a direct reading of W/d and can make a "good-bad" decision for a binning operation. The size of the test pattern can be as small as a square of 0.5 millimeters on a side, and the wavelength of the laser light beam 20 is such that it does not interfere with the photoresist process. By utilizing a wafer loading system which is consistent with existing photoresist application and alignment systems and by interfacing a microprocessor to this system, the present technique allows for rapid and objective testing of the lateral dimensions of integrated circuit patterns, resulting in considerable savings in the man-hours needed for testing such patterns.

What is claimed is:

1. A method of optically testing the lateral dimensions of a pattern of material disposed on a substrate comprising the steps of:

applying said material to both said substrate and a test surface, selectively removing said material from both said substrate and said test surface simultaneously to form respectively said pattern on said substrate and a diffraction grating on said test surface including spaced strips of said material having a strip width W and a periodicity d, exposing said diffraction grating to a beam of monochromatic light, whereby said diffraction grating and said test surface therebeneath function as a relief pattern, diffracting said beam of monochromatic light into diffracted beams of various orders, measuring the intensity of two of the diffracted beams ($I_1$ and $I_2$) to obtain two intensity signals, transmitting said intensity signals ($I_1$ and $I_2$) to processing means for determining the strip width W, and comparing said strip width W with a pre-established value to obtain a difference signal, whereby the magnitude of said difference signal is a measure for the lateral dimensional tolerance of said pattern.

2. A method as recited in claim 1 wherein one diffracted beam intensity ($I_1$) is the first order beam intensity, wherein the other diffracted beam intensity ($I_2$) is the second order beam intensity, wherein said diffraction grating is a rectangular relief pattern, and wherein said processing means for determining said strip width W utilizes the approximation $W = d/\pi \cos^{-1}\sqrt{I_2/I_1}$.

3. A method as recited in claim 2 wherein said material is selected from the group consisting of photoresist, silicon dioxide, silicon nitride, polycrystalline silicon and metal.

4. A method as recited in claim 3 wherein said test surface comprises a knock-out section of said substrate.

5. A method as recited in claim 4 wherein said beam of monochromatic light strikes said rectangular relief pattern uniformly at an angle acute to the plane of said relief pattern.

6. A method as recited in claim 2 wherein said beam of monochromatic light strikes and rectangular relief pattern uniformly at an angle of incidence $\theta_I$ equal to Brewster's angle, defined by the relationship $\text{TAN } \theta_I = n$, where n is the refractive index of said material.

7. A method as recited in claim 1 wherein said measuring step is performed by utilizing photodetectors placed respectively at angular positions to receive said first order and said second order beams.

8. A method as recited in claim 7 wherein said photodetectors are silicon PIN diodes.

9. A method as recited in claim 1 wherein said beam of monochromatic light is a laser beam.

10. A method as recited in claim 1 wherein said substrate is a silicon wafer, wherein said strip width W is about 5 micrometers and wherein said periodicity d is about 20 micrometers.

* * * * *